(12) United States Patent
Kozicki

(10) Patent No.: US 6,914,802 B2
(45) Date of Patent: Jul. 5, 2005

(54) MICROELECTRONIC PHOTONIC STRUCTURE AND DEVICE AND METHOD OF FORMING THE SAME

(75) Inventor: Michael N. Kozicki, Phoenix, AZ (US)

(73) Assignee: Axon Technologies Corporation, Scottsdale, AZ (US)

( * ) Notice: Subject to any disclaimer, the term of this patent is extended or adjusted under 35 U.S.C. 154(b) by 161 days.

(21) Appl. No.: 10/163,059

(22) Filed: Jun. 4, 2002

(65) Prior Publication Data

US 2003/0048519 A1 Mar. 13, 2003

Related U.S. Application Data

(63) Continuation-in-part of application No. 10/118,276, filed on Apr. 8, 2002, and a continuation-in-part of application No. 09/951,882, filed on Sep. 10, 2001, now Pat. No. 6,635,914, and a continuation-in-part of application No. 09/502,915, filed on Feb. 11, 2000, now Pat. No. 6,487,106.

(60) Provisional application No. 60/368,579, filed on Mar. 29, 2002, and provisional application No. 60/298,496, filed on Jun. 5, 2001.

(51) Int. Cl.[7] .............................................. G11C 11/00

(52) U.S. Cl. .................................. 365/153; 257/3; 257/4

(58) Field of Search ............................. 365/153; 257/3, 257/4, 296, 508

(56) References Cited

U.S. PATENT DOCUMENTS

| | | | |
|---|---|---|---|
| 4,256,379 A | | 3/1981 | Green |
| 5,761,115 A | | 6/1998 | Kozicki et al. |
| 6,311,004 B1 | * | 10/2001 | Kenney et al. ............. 385/130 |
| 6,438,298 B1 | * | 8/2002 | Matsui et al. ................. 385/50 |

FOREIGN PATENT DOCUMENTS

| | | |
|---|---|---|
| EP | 0 434 359 A3 | 6/1991 |
| EP | 0 434 359 A2 | 6/1991 |

* cited by examiner

*Primary Examiner*—Son T. Dinh
(74) *Attorney, Agent, or Firm*—Snell & Wilmer L.L.P.

(57) ABSTRACT

A microelectronic photonic structure and a device and a system including the structure are disclosed. The photonic structure includes an ion conductor and a plurality of electrodes. Optical properties of the structure are altered by applying energy across the electrodes.

21 Claims, 7 Drawing Sheets

MICROELECTRONIC PHOTONIC STRUCTURE AND DEVICE AND METHOD OF FORMING THE SAME

CROSS REFERENCE TO RELATED APPLICATIONS

This application is a CIP of U.S. patent application Ser. No. 09/502,915, entitled PROGRAMMABLE MICROELECTRONIC DEVICES AND METHODS OF FORMING AND PROGRAMMING SAME, filed Feb 11, 2000 now U.S. Pat. No. 6,487,106; and is a CIP of U.S. patent application Ser. No. 09/951,882, entitled MICROELECTRONIC PROGRAMMABLE DEVICE AND METHODS OF FORMING AND PROGRAMMING THE SAME, filed Sep. 10, 2001 now U.S. Pat. No. 6,635,914, and is a CIP of; United States Patent Application Serial No. 10/118,276, entitled MICROELECTRONIC DEVICE, STRUCTURE, AND SYSTEM, INCLUDING A MEMORY STRUCTURE HAVING A VARIABLE PROGRAMMABLE PROPERTY AND METHOD OF FORMING THE SAME, filed Apr. 8, 2002; and claims benefit of U.S. Patent Application Serial No. 60/298,496, entitled OPTICAL DEVICES BASED ON PROGRAMMABLE METALLIZATION CELL TECHNOLOGY, filed Jun. 5, 2001; and claims benefit of U.S. Patent Application Serial No. 60/368,579, entitled FAST OPTICAL ROUTERS BASED ON PROGRAMMABLE METALLIZATION CELL TECHNOLOGY, filed Mar. 29, 2002.

FIELD OF THE INVENTION

The present invention generally relates to microelectronic photonic devices. More particularly, the invention relates to photonic structures and devices having an optical property that can be variably altered by manipulating an amount of energy supplied to the structure.

BACKGROUND OF THE INVENTION

Microelectronic optical or photonic devices and systems including such devices may be used in a variety of applications. For example, optical devices are used ill passive displays such as liquid crystal displays (LCDs), high-definition television displays, modulators, filters, and the like.

In the case of LCD devices, an image is created by blocking or allowing transmission of light between a source and a screen or a display area. In particular, liquid crystal material, in conjunction with polarizing material and a mirror, is used to alter the transmission of light based on an applied electric filed. The applied electric field causes molecules within the liquid crystal material to align and form a quasi-crystalline structure, which in turn alters the reflectivity of the material. This change in reflectivity only persists for so long as the electric field is applied to the liquid crystal material. Thus, energy must be supplied to the liquid crystal material to maintain its orientation even when a displayed image is constant.

Use of liquid crystal material in connection with passive optical devices may be problematic in several regards. For example, as noted above, energy must be applied to the liquid crystal material to maintain information. In addition, the liquid crystal and a semiconductor circuit for operating the LCD are generally formed on separate substrates and must be mechanically and electrically coupled to each other. Coupling devices formed on separate substrates may be undesirably expensive and time consuming. Accordingly, improved photonic devices suitable for passive display applications and systems including the devices are desired.

Other applications where photonic devices are well suited include optical switches for use with routers in data communication systems. Presently, routers include optoelectronic components to convert optical information to electrical signals, components to filter and amplify the electronic signals, components to rout the electrical signals, and components to convert the electrical signals to optical information for further transmission. Use of electronic components to switch and rout optical information may be undesirable for several reason. For example, information integrity may be reduced by the conversion between optical and electrical signals, and the employment of electronic components may undesirably add to the cost and complexity of the switch and/or router. Improved methods and apparatus for switching and routing optical information are therefore desired.

Photonic devices may also include tunable grating devices for use as filters. In this case, the photonic device is coupled to a semiconductor circuit to operate the filter. Forming the photonic and electronic devices on separates substrate is undesirable for the reasons noted above. Accordingly, improved methods and apparatus for forming tunable grating devices and filters are desired.

SUMMARY OF THE INVENTION

The present invention provides improved photonic devices, structures, and systems and methods of forming the same. More particularly, the invention provides photonic structures that have at least one optical property that can be variably altered upon application of energy to the structure.

The ways in which the present invention addresses various drawbacks of now-known photonic devices are discussed in greater detail below. However, in general, the present invention provides a structure that can be integrated on a single substrate with a microelectronic device. In addition, the present invention provides photonic devices that are relatively easy and inexpensive to manufacture and that do not require constant application of power to maintain information.

In accordance with one exemplary embodiment of the present invention, a photonic structure includes an ion conductor and at least two electrodes. The structure is configured such that when an energy bias is applied across the two electrodes, one or more optical properties of the structure change. In accordance with one aspect of this embodiment, a transparency of a portion of the structure changes upon application of a bias across the electrodes. In accordance with another aspect of this embodiment, reflectivity of a portion of the structure is altered upon application of a bias across the electrodes. In accordance with yet a further aspect of this embodiment, a refractive index of a portion of the structure is altered upon application of a bias across the electrodes.

In accordance with various embodiments of the invention, an optical property of a structure can be reversibly altered. In accordance with one aspect of this embodiment, a photonic structure includes an ion conductor, a first electrode formed of a soluble material and a second electrode formed of an inert material. In accordance with various aspects of this embodiment, the structure also includes a barrier layer interposed between the ion conductor and one of the electrodes.

In accordance with further embodiments of the invention, an optical system includes a photonic structures in accordance with the present invention and an optoelectronic device (e.g., a light emitting device or a light detecting device).

In accordance with additional embodiments of the invention, an optical system includes an optoelectronic device, a waveguide, and a photonic device.

In accordance with another embodiment of the invention, an optical switch is formed using a photonic structure of the present invention. In accordance with one aspect of this embodiment, an optical router device is formed using the optical switch.

In accordance with another embodiment of the invention, a passive display device is formed using a photonic structure of the present invention.

BRIEF DESCRIPTION OF THE DRAWINGS

A more complete understanding of the present invention maybe derived by referring to the detailed description and claims, considered in connection with the figures, wherein like reference numbers refer to similar elements throughout the figures, and:

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The present invention generally relates to photonic structures and devices and to systems including the structures and devices. More particularly, the invention relates photonic structures that have a characteristic that can be altered, and in some cases reversibly altered, by application of energy such as electricity or light to the structure.

Figure 1:
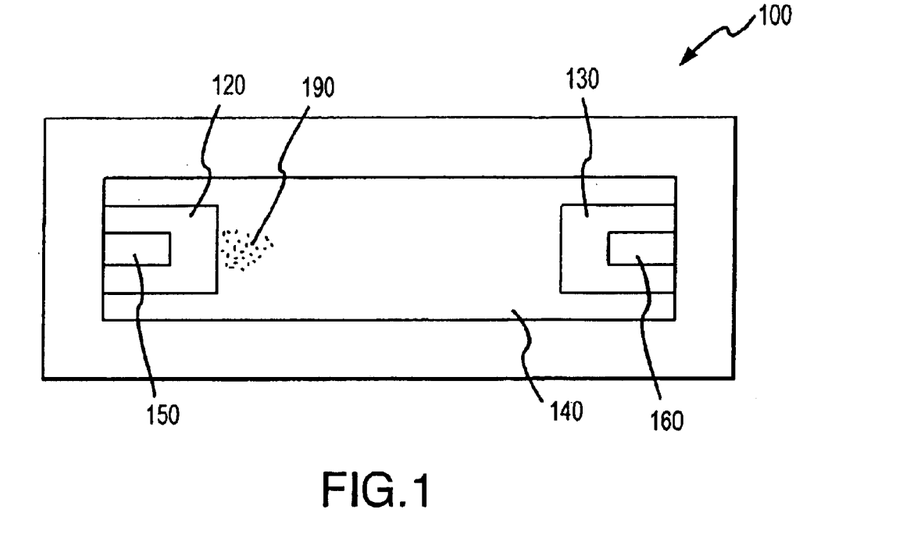
FIG. 1 is a top plan illustration of a photonic structure formed on a surface of a substrate in accordance with the present invention.
Figure 2:
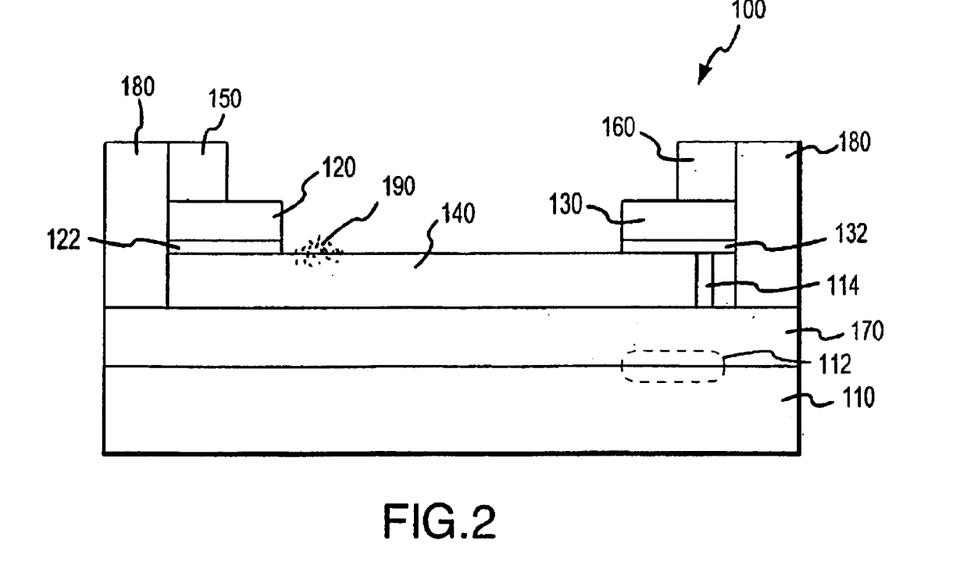
FIG. 2 is a cross-sectional illustration of the photonic structure illustrated in FIG. 1.

FIGS. 1 and 2 illustrate a photonic structure 100 formed on a surface of a substrate 110 in accordance with an exemplary embodiment of the present invention. As described in more detail below, structure 100 is configured to change or alter an optical property upon application of energy to the structure. Although the applied energy may be in various formed such as radiation, thermal, and the like, the invention is conveniently described herein in connection with application of electrical energy to alter an optical property of a structure.

Exemplary structure 100 includes electrodes 120 and 130, an ion conductor 140, contacts 150 and 160, and insulating layers 170 and 180. As described in greater detail below, photonic structures in accordance with the present invention may also include additional layers such as barrier layers to, for example, facilitate reversible and reliable operation of the structure.

Generally, structure 100 is configured such that when a bias greater than a threshold voltage ($V_T$) is applied across electrodes 120 and 130, one or more optical properties of structure 100 change. For example, in accordance with one embodiment of the invention, as a voltage $V \geq V_T$ is applied across electrodes 120 and 130, conductive ions within ion conductor 140 begin to migrate and form a region 190, having an increased concentration of conductive material compared to bulk ion conductor material, at or near the more negative of electrodes 120 and 130. Region 190 may form and electrodeposit of solid metal; however, such an electrodeposit is not required to practice the present invention.

As region 190 forms the, index of refraction, transparency, reflectivity, and/or other optical property of region 190 changes. For example, the transparency of region 190 generally decreases and reflectivity generally increases as region 190 begins to form.

In the absence of any barriers layers, which are discussed in more detail below, the threshold voltage required to form region 190 from one electrode toward the other and thereby alter an optical property of a portion of structure 100 is approximately the redox potential of the system including ion conductor 140 and electrodes 120 and 130—typically a few hundred millivolts. In accordance with some embodiments of the invention, if the same voltage is applied in reverse, region 190 will dissolve back into the ion conductor and the device will return to an initial state.

A photonic structure may suitably be erased by reversing a bias applied during a write operation, wherein a magnitude of the applied bias is equal to or greater than the threshold voltage for electrodeposition in the reverse direction. In accordance with an exemplary embodiment of the invention, a sufficient erase voltage ($V \geq V_T$) is applied to structure 100 for a period of time, which depends on energy supplied during the write operation, but is typically less than about 1 millisecond to return structure 100 to its original state.

In accordance with various embodiments of the invention, the volatility of a photonic structure (e.g., structure 100) can be manipulated by altering an amount of energy (e.g., altering time, current, voltage, thermal energy, and/or the like) applied during region 190 growth or a "write" process. In general, the greater the amount of energy (having a value greater than the threshold energy for the write process) applied during the write process, the greater the growth of region 190 and hence the less volatile the region. Conversely, a relatively volatile region can be formed by supplying relatively little energy across ion conductor 140. Thus, relatively volatile photonic devices can be formed using the same or similar structures used to form nonvolatile devices, and less energy can be used to form the volatile devices. More volatile photonic structures may be desirable where fast switching of a structure is desired—for example, in passive display and/or switching applications where information is likely to be updated at a relatively fast rate. The volatile and nonvolatile photonic structures may be formed on the same substrate and partitioned or separated from each other such that each partition is dedicated to either volatile or nonvolatile devices; or, an array of devices may be configured as volatile or nonvolatile photonic devices using programming techniques, such that the configuration (i.e., volatile or nonvolatile) of the device can be altered by changing an amount of energy supplied during programming the respective portions of the array.

Referring again to FIGS. 1 and 2, substrate 110 may include any suitable material. For example, substrate 110 may include semiconductive, conductive, semiinsulative, insulative material, or any combination of such materials. In accordance with one embodiment of the invention, substrate 110 comprises a semiconductor substrate and includes a micro electronic device 112 formed using a portion of substrate 110. Device 112 may include any passive or active semiconductor device, such as, for example, light emitting devices, light detecting devices, drivers, amplifiers, transistors, or other circuits, devices, or components. If desired, device 112 may be electrically coupled to an electrode using electrical connector 114 (e.g., a conductive plug or trace).

Insulating layers 170 and 180 may include any suitable dielectric or insulating material. For example, layers 170 and 180 may be formed of silicon oxide, silicon nitride, silicon oxynitride, polymeric materials such as polyimide or parylene, or any combination of such materials.

Substrate 110 and ion conductor 114 may be separated by additional layers (not shown) such as, for example, layers typically used to form integrated circuits. Because the photonic structures can be formed over insulating or other materials, the structures of the present invention are particularly well suited for applications where substrate (e.g., semiconductor material) space is a premium. In addition, forming a photonic structure overlying a microelectronic device may be advantageous because such a configuration allows greater integration of photonic structures and microelectronic devices such as device 112.

Electrodes 120 and 130 may be formed of any suitable conductive material. For example, electrodes 120 and 130 may be formed of doped polysilicon material or metal. In accordance with one exemplary embodiment of the invention, one of electrodes 120 and 130 is formed of a material including a metal that dissolves in ion conductor 140 when a sufficient bias ($V \geq V_T$) is applied across the electrodes (an oxidizable or soluble electrode) and the other electrode is relatively inert and does not dissolve during operation of the programmable device (an indifferent or inert electrode). For example, electrode 120 maybe an anode during a write process and be comprised of a material including silver that dissolves in ion conductor 140 and electrode 130 may be a cathode during the write process and be comprised of an inert material such as tungsten, nickel, molybdenum, platinum, metal silicides, and the like. Having at least one electrode formed of a material including a metal which dissolves in ion conductor 140 facilitates maintaining a desired dissolved metal concentration within ion conductor 140, which in turn facilitates rapid and stable region 190 formation within ion conductor 140. Furthermore, use of an inert material for the other electrode (cathode during a write operation) facilitates electrodissolution of region 190 and/or return of the photonic device to an "erased" state after application of a sufficient voltage.

In cases where only one growth step is contemplated electrodes 120 and 130 may be formed of the same material. In this case, an optical device is configured for a particular application by use of an electrical write process that causes growth of region 190, which alters an optical property of the device. These devices can be use in optical fiber modules as will as in integrated optoelectronic systems. The ability to created permanent optical changes in this manner is useful in, among other things, programmable systems and self repairing/self-reconfiguring systems that have redundant element designed to improve the reliability of the systems (e.g., buried or underwater network infrastructures, satellites aircrafts, military applications, and the like). One-time write photonic structures are relatively easy to fabricate and may be formed using only a single masking step and one metal deposition and etch step to form both electrodes 120 and 130, which may both be formed of a material that dissolves into ion conductor 130 to form region 190.

In accordance with one embodiment of the invention, at least one electrode 120 and 130 is formed of material suitable for use as an interconnect metal. For example, electrode 130 may form part of an interconnect structure within a semiconductor integrated circuit. In accordance with one aspect of this embodiment, electrode 130 is formed of a material that is substantially insoluble in material comprising ion conductor 140. Exemplary materials suitable for both interconnect and electrode 130 material include metals and compounds such as tungsten, nickel, molybdenum, platinum, metal silicides, and the like.

During an erase operation, dissolution of region 190 that may have formed preferably begins at or near the oxidizable electrode/electrodeposit interface. Initial dissolution of region 190 at the oxidizable electrode/electrodeposit interface may be facilitated by forming structure 100 such that the resistance at the oxidizable electrode/region 190 interface is greater than the resistance at any other point along the region, particularly, the interface between region 190 and the indifferent electrode.

One way to achieve relatively low resistance at the indifferent electrode is to form the electrode of relatively inert, non-oxidizing material such as platinum. Use of such material reduces formation of oxides at the interface between ion conductor 140 and the indifferent electrode as well as the formation of compounds or mixtures of the electrode material and ion conductor 140 material, which typically have a higher resistance than ion conductor 140 or the electrode material.

Reliable growth and dissolution of region 190 can also be facilitated by providing a roughened indifferent electrode surface (e.g., a root mean square roughness of greater than about 1 nm) at the electrode/ion conductor interface. The roughened surface may be formed by manipulating film deposition parameters and/or by etching a portion of one of the electrode of ion conductor surfaces. During a write operation, relatively high electrical fields form about the spikes or peaks of the roughened surface, and thus the electrodeposits are more likely to form about the spikes or peaks. As a result, more reliable and uniform changes in optical properties for an applied voltage across electrodes 120 and 130 may be obtained by providing a roughed interface between the indifferent electrode (cathode during a write operation) and ion conductor 140.

Oxidizable electrode material may have a tendency to thermally dissolve or diffuse into ion conductor 140, particularly during fabrication and/or operation of structure 100. The thermal diffusion may be problematic because it may undesirably and uncontrollably change an optical property during use of structure 100 without a write or erase operation.

To reduce undesired diffusion of oxidizable electrode material into ion conductor 140 and in accordance with another embodiment of the invention, the oxidizable electrode includes a metal intercalated in a transition metal sulfide or selenide material such as $A_x(MB_2)_{1-x}$, where A is Ag or Cu, B is S or Se, M is a transition metal such as Ta, V, and Ti, and x ranges from about 0.1 to about 0.7. The intercalated material mitigates undesired thermal diffusion of the metal (Ag or Cu) into the ion conductor material, while allowing the metal to participate in region 190 growth upon application of a sufficient voltage across electrodes 120 and 130. For example, when silver is intercalated into a $TaS_2$ film, the $TaS_2$ film can include tip to about 67 atomic percent silver. The $A_x(MB_2)_{1-x}$ material is preferably amorphous to prevent undesired diffusion of the metal though the material. The amorphous material may be formed by, for example, physical vapor deposition of a target material comprising $A_x(MB_2)_{1-x}$.

α-AgI is another suitable material for the oxidizable electrode, as well as the indifferent electrode. Similar to the $A_x(MB_2)_{1-x}$ material discussed above, α-AgI can serve as a source of Ag during operation of structure 100—e.g., upon application of a sufficient bias, but the silver in the AgI material does not readily thermally diffuse into ion conductor 140. AgI has a relatively low activation energy for conduction of electricity and does not require doping to achieve relatively high conductivity. When the oxidizable electrode is formed of AgI, depletion of silver in the AgI layer may arise during operation of structure 100, unless excess silver is provided to the electrode. One way to provide the excess silver is to form a silver layer adjacent the AgI layer as discussed above in connection with forming an Ag electrode adjacent ion conductor 140. The AgI layer reduces thermal diffusion of Ag into ion conductor 140, but does not significantly affect conduction of Ag during operation of structure 100. In addition, use of AgI increases the operational efficiency of structure 100 because the AgI mitigates non-Faradaic conduction (conduction of electrons that do not participate in the electrochemical reaction).

As noted above, structures in accordance with various embodiments of the invention optionally include barrier or buffer layers such as layers 122 and 132. Exemplary materials suitable for buffer layers 122 and/or 132 include $GeO_2$ and $SiO_x$. Amorphous $GeO_2$ is relatively porous an will "soak up" silver or other dissolved conductive material during operation of device 100, but will retard the thermal diffusion of the conductive material to ion conductor 140, compared to structures or devices that do not include a buffer layer. When ion conductor 140 includes germanium, $GeO_2$ may be formed by exposing ion conductor 140 to an oxidizing environment at a temperature of about 300° C. to about 800° C. or by exposing ion conductor 140 to an oxidizing environment in the presence of radiation having an energy greater than the band gap of the ion conductor material. The $GeO_2$ may also be deposited using physical vapor deposition (from a $GeO_2$ target) or chemical vapor deposition (from $GeH_4$ and an $O_2$).

Buffer layers can also be used to obtain relatively low resistance at the indifferent electrode by forming a barrier layer between the oxidizable electrode (anode during a write operation) and the ion conductor, wherein the barrier layer is formed of material having a relatively high resistance. Exemplary high resistance materials include ion conducting materials (e.g., $Ag_xO$, $Ag_xS$, $Ag_xSe$, $Ag_xTe$, where $x \geq 2$, $Ag_yI$, where $x \geq 1$, $CuI_2$, $CuO$, $CuS$, $CuSe$, $CuTe$, $GeO_2$, $Ge_zS_{1-z}$, $Ge_zSe_{1-z}$, $Ge_zTe_{1-z}$, where z is greater than or equal to about 0.33), $SiO_2$, and combinations of these materials interposed between ion conductor 140 and a metal layer such as silver.

Buffer layers can also be used to increase a "write voltage" by placing the buffer layer (e.g., $GeO_2$ or $SiO_x$) between ion conductor 140 and the indifferent electrode. In this case, the buffer material allows metal such as silver to diffuse though the buffer and take part in the electrochemical reaction.

Barrier layers 122 and/or 132 may also include a material that restricts migration of ions between conductor 140 and the electrodes. In accordance with exemplary embodiments of the invention, a barrier layer includes conducting material such as titanium nitride, titanium tungsten, a combination thereof, or the like. The barrier may be electrically indifferent, i.e., it allows conduction of electrons through structure 100, but it does not itself contribute ions to conduction through structure 100. An electrically indifferent barrier may reduce undesired region 190 growth during operation of the device, and thus may facilitate an "erase" or dissolution of region 190 when a bias is applied which is opposite to that used to grow or form the region. In addition, use of a conducting barrier allows for the "indifferent" electrode to be formed of oxidizable material because the barrier prevents diffusion of the electrode material to the ion conductor.

Ion conductor 140 is formed of material that conducts ions upon application of a sufficient voltage. Suitable materials for ion conductor 140 include glasses and semiconductor materials. In one exemplary embodiment of the invention, ion conductor 140 is formed of chalcogenide material.

Ion conductor 140 may also suitably include dissolved conductive material. For example, ion conductor 140 may comprise a solid solution that includes dissolved metals and/or metal ions. In accordance with one exemplary embodiment of the invention, conductor 140 includes metal and/or metal ions dissolved in chalcogenide glass. Exemplary chalcogenide glasses with dissolved metal suitable for use in forming structure 100 include solid solutions of $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, $Ge_xTe_{1-x}$—Ag where x ranges from about 0.1 to about 0.5, other chalcogenide materials including silver, copper, zinc, combinations of these materials, and the like. In addition, conductor 140 may include network modifiers that affect mobility of ions through conductor 140. For example, materials such as metals (e.g., silver), halogens, halides, or hydrogen may be added to conductor 140 to enhance ion mobility and thus increase erase/write speeds of the structure.

As discussed in more detail below, in accordance with various aspects of the invention, ion conductor 140 is preferably transparent or substantially transparent for the light wavelengths of interest. In this case, layer 140 is preferable less than or about equal to 100 Å.

A solid solution suitable for use as ion conductor 140 may be formed in a variety of ways. For example, the solid solution may be formed by depositing a layer of conductive material such as metal over an ion conductive material such as chalcogenide glass and exposing the metal and glass to thermal and/or photo dissolution processing. In accordance with one exemplary embodiment of the invention, a solid solution of $As_2S_3$—Ag is formed by depositing $As_2S_3$ onto a substrate, depositing a thin film of Ag onto the $As_2S_3$, and exposing the films to light having energy greater than the optical gap of the $As_2S_3$,—e.g., light having a wavelength of less than about 500 nanometers. If desired, network modifiers may be added to conductor 140 during deposition of conductor 140 (e.g., the modifier is in the deposited material or present during conductor 140 material deposition) or after conductor 140 material is deposited (e.g., by exposing conductor 140 to an atmosphere including the network modifier).

In accordance with another embodiment of the invention, a solid solution may be formed by depositing one of the constituents onto a substrate or another material layer and reacting the first constituent with a second constituent. For example, germanium (preferably amorphous) maybe deposited onto a portion of a substrate and the germanium may be reacted with $H_2Se$ to form a Ge—Se glass. Similarly, arsenic can be deposited and reacted with the $H_2Se$ gas, or arsenic or germanium can be deposited and reacted with $H_2S$ gas. Silver or other metal can then be added to the glass as described above.

In accordance with one aspect of this embodiment, a solid solution ion conductor 140 is formed by depositing sufficient metal onto an ion conductor material such that a portion of the metal can be dissolved within the ion conductor material and a portion of the metal remains on a surface of the ion conductor to form an electrode (e.g., electrode 120). In accordance with alternative embodiments of the invention, solid solutions containing dissolved metals maybe directly deposited onto substrate 110 and the electrode then formed overlying the ion conductor.

An amount of conductive material such as metal dissolved in an ion conducting material such as chalcogenide may depend on several factors such as an amount of metal available for dissolution and an amount of energy applied during the dissolution process. However, when a sufficient amount of metal and energy are available for dissolution in chalcogenide material using photodissolution, the dissolution process is thought to be self limiting, substantially halting when the metal cations have been reduced to their lowest oxidation state. In the case of $As_2S_3$—Ag, this occurs at $Ag_4As_2S_3=2Ag_2S+As_2S$, having a silver concentration of about 44 atomic percent. If, on the other hand, the metal is dissolved in the chalcogenide material using thermal dissolution, a higher atomic percentage of metal in the solid solution may be obtained, provided a sufficient amount of metal is available for dissolution.

In accordance with a further embodiment of the invention, the solid solution is formed by photodissolution to form a macrohomogeneous ternary compound and additional metal is added to the solution using thermal diffusion (e.g., in an inert environment at a temperature of about 85° C. to about 150° C.) to form a solid solution containing, for example, about 30 to about 50, and preferably about 34 atomic percent silver. Ion conductors having a metal concentration above the photodissolution solubility level facilitates formation of region 190 that is thermally stable at operating temperatures (typically about 85° C. to about 150° C.) of device 100. Alternatively, the solid solution may be formed by thermally dissolving the metal into the ion conductor at the temperature noted above; however, solid solutions formed exclusively from photodissolution are thought to be less homogeneous than films having similar metal concentrations formed using photodissolution and thermal dissolution.

Ion conductor 140 may also include a filler material, which fills interstices or voids. Suitable filler materials include non-oxidizable and non-silver based materials such as a non-conducting, immiscible silicon oxide and/or silicon nitride, having a cross-sectional dimension of less than about 1 nm, which do not contribute to the growth of an electrodeposit. In this case, the filler material is present in the ion conductor at a volume percent of up to about 5 percent to reduce a likelihood that an electrodeposit will spontaneously dissolve into the supporting ternary material as the device is exposed to elevated temperature, which leads to more stable device operation without compromising the performance of the device. Ion conductor 140 may also include filler material to reduce an effective cross-sectional area of the ion conductor. In this case, the concentration of the filler material, which may be the same filler material described above but having a cross-sectional dimension up to about 50 nm and be present in the ion conductor material at a concentration of up to about 50 percent by volume. The filler material may also include metal such as silver or copper to fill the voids in the ion conductor material.

In accordance with one exemplary embodiment of the invention, ion conductor 140 includes a germanium-selenide glass with silver diffused in the glass. Germanium selenide materials are typically formed from selenium and $Ge(Se)_{4/2}$ tetrahedra that may combine in a variety of ways. In a Se-rich region, Ge is 4-fold coordinated and Se is 2-fold coordinated, which means that a glass composition near $Ge_{0.20}Se_{0.80}$ will have a mean coordination number of about 2.4. Glass with this coordination number is considered by constraint counting theory to be optimally constrained and hence very stable with respect to devitrification. The network in such a glass is known to self-organize and become stress-free, making it easy for any additive, e.g., silver, to finely disperse and form a mixed-glass solid solution. Accordingly, in accordance with one embodiment of the invention, ion conductor 140 includes a glass having a composition of $Ge_{0.17}Se_{0.83}$ to $Ge_{0.25}Se_{0.75}$.

The composition and structure of ion conductor 140 material often depends on the starting or target material used to form the conductor. Generally, it is desired to form a homogenous material layer with low oxygen content for conductor 140 to facilitate reliable and repeatable device performance.

Contacts 150 and 160 may suitably be electrically coupled to one or more electrodes 120, 130 to facilitate forming electrical contact to the respective electrode. Contacts 150 and 160 may be formed of any conductive material and are preferably formed of a metal, alloy, or composition including aluminum, tungsten, or copper.

Figure 3:
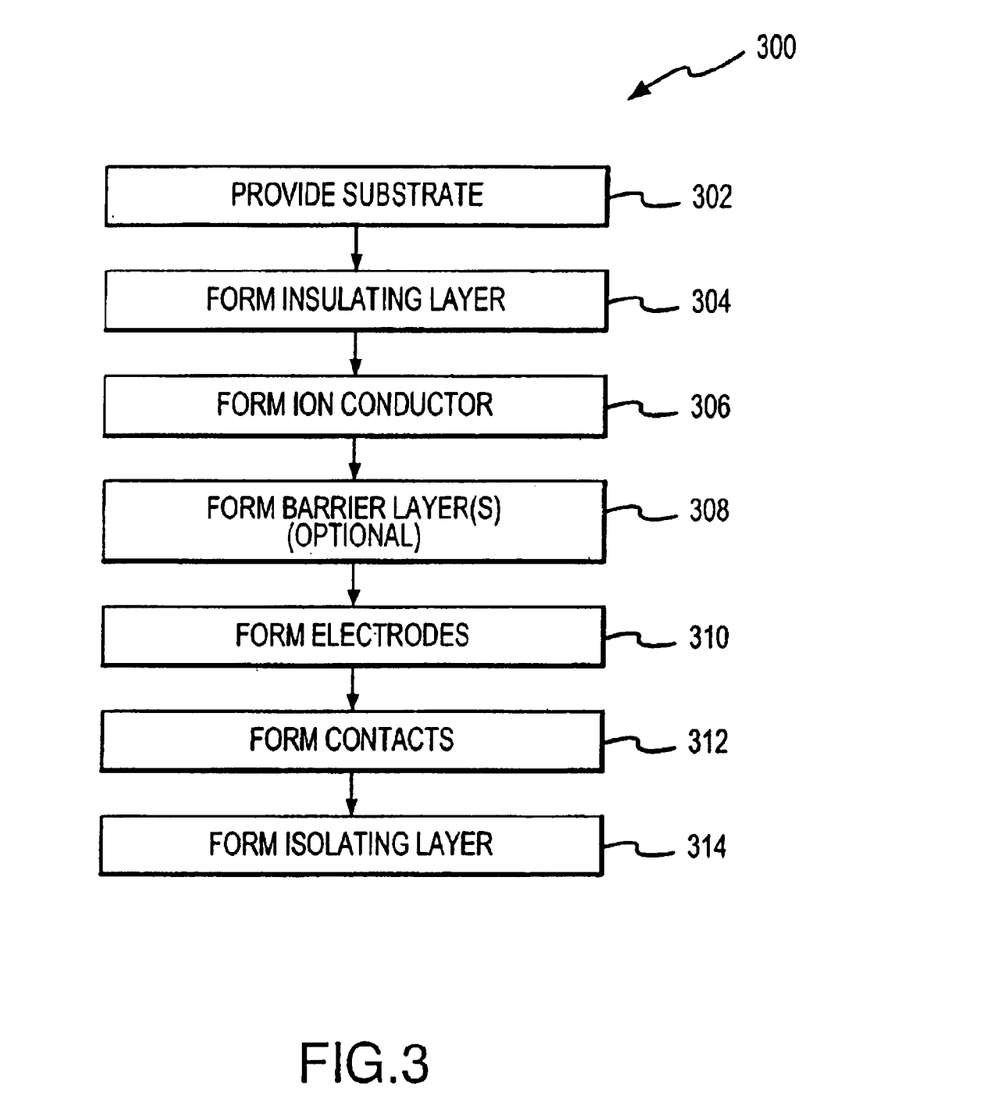
FIG. 3 is an illustration of a process of forming a photonic structure in accordance with an exemplary embodiment of the present invention.
Figure 9:
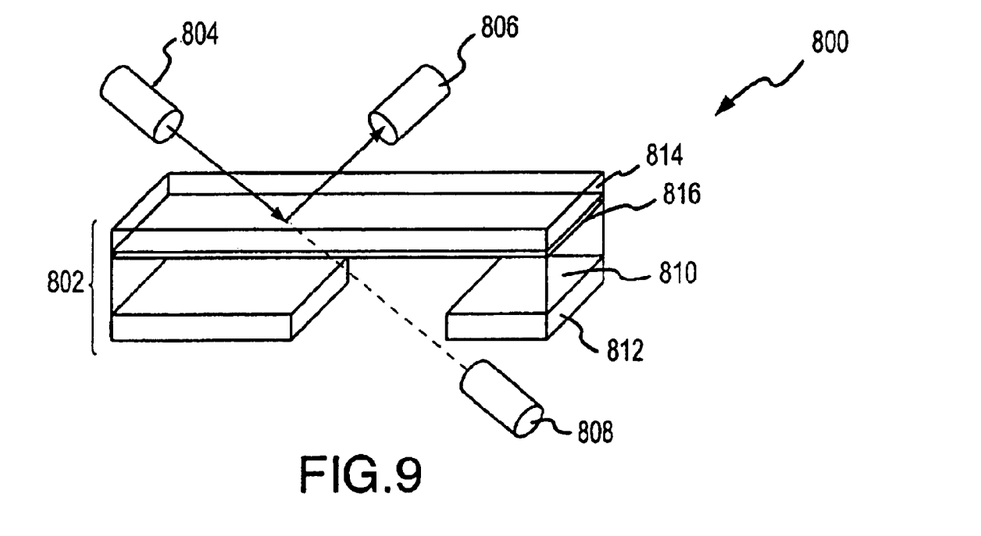

FIG. 3 illustrates a process for forming a photonic structure, such as structure 100, in accordance with the present invention. Process 300 begins with providing a substrate (step 302). As noted above, the substrate may include semiconductor material having a devices formed using the substrate material. To isolate the substrate from the photonic device, an insulating layer (e.g., layer 170) is formed overlying the substrate (step 304). Next, ion conductor 140 is formed by depositing ion conducting material as described above and using a suitable mask and etch process to form the conductor in a desired pattern (step 306). Process 300 optionally includes the step of forming barrier layers such as layers 122 and 132 described above. The barrier layers may be formed by, for example, depositing a suitable barrier material, patterning the barrier material, and etching the material to form the desired pattern of electrodes (step 308). Electrodes 120 and 130 may similarly be formed by depositing a layer of electrode material, patterning the electrode material, and etching the material to form the electrodes (step 310). As noted above, photonic structures in accordance with the present invention may include electrodes formed of different material. In this case, the electrode formation step may comprise two sub-steps: one to form each electrode. Once electrodes 120 and 130 are formed, insulating or isolating layer 180 and contacts 150 are formed (steps 312 and 314), using, for example the deposition and etch technique described above, damascene techniques, or other suitable processes. Further, as illustrated in FIG. 9, a substrate etch may be used to facilitate light transmission through ion conductor 140.

Figure 4:
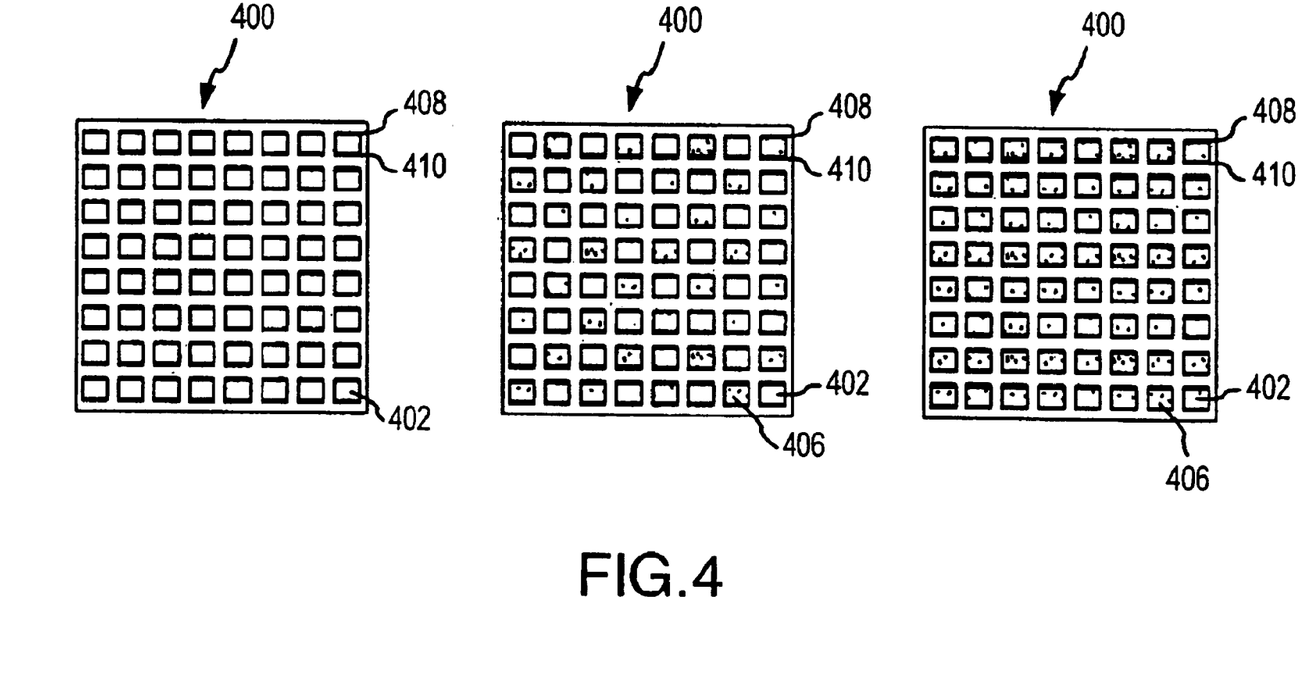
FIG. 4 is a top plan illustration of a phonic structure array in accordance with yet another embodiment of the present invention.
Figure 5:
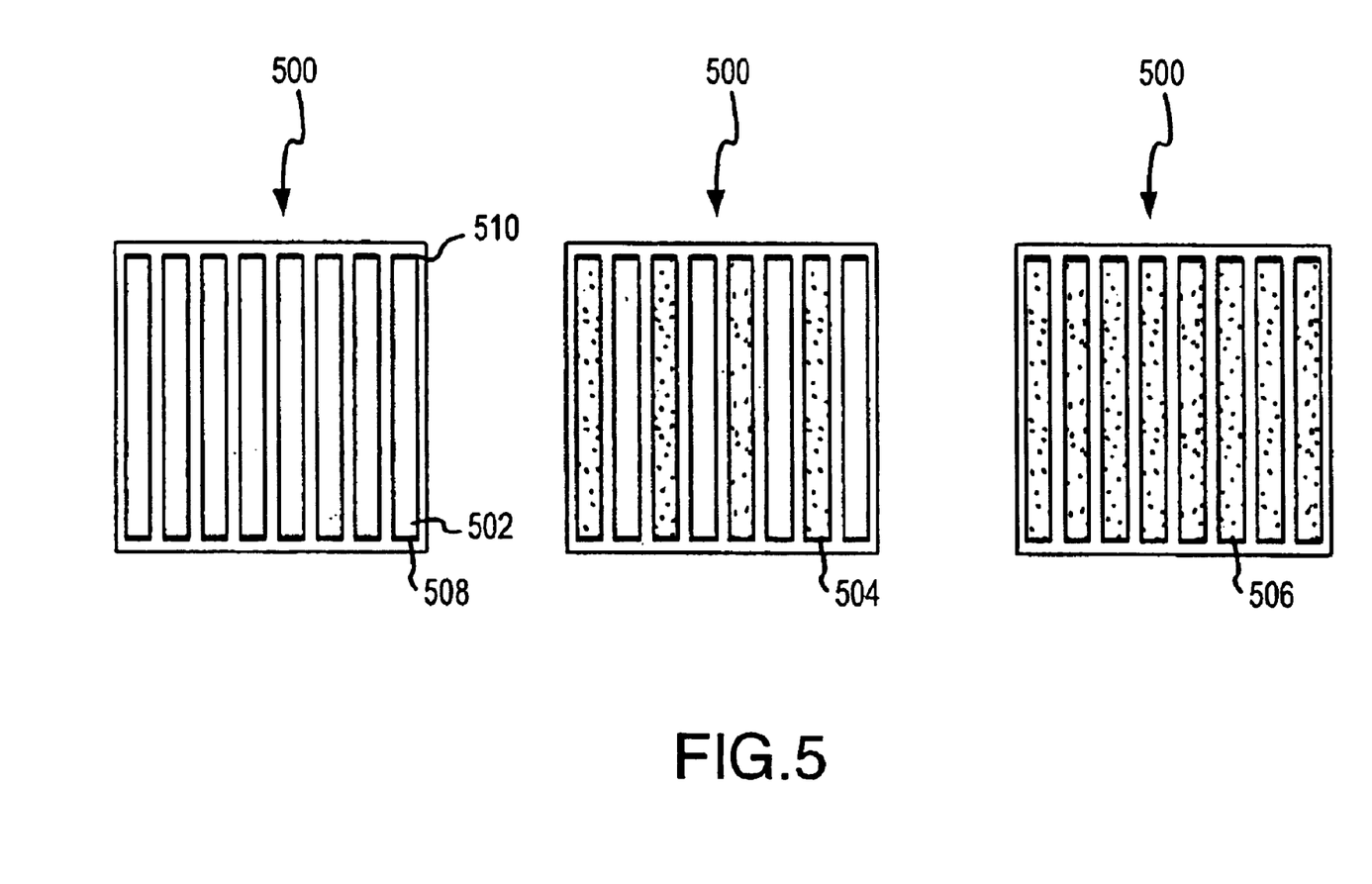
FIG. 5 is a top plan illustration of a photonic structure array in accordance with another exemplary embodiment of the present invention.

FIGS. 4 and 5 illustrate top plan views of arrays 400 and 500 of photonic structures, suitable for passive display and similar applications, in accordance with exemplary embodiments of the invention. Although the arrays are illustrated with square or rectangular structures and with a specific number of structures, any suitable geometric shape and/or number of structures may be used to form an array in accordance with the present invention.

As illustrated in FIG. 4, array 400 includes a plurality of independently accessible structures 402, which may be variably, optically altered, and which may be reversibly altered, as described above. As illustrated in FIG. 4, upon application of energy across electrodes 408 and 410, some of the photonic structures 402 become altered such that an optical property partially changes (illustrated as element 404), such that cell 404 is partially reflective or opaque, and may be further altered to form cells 406, which may be completely or substantially completely reflective or opaque in the light wavelengths of interest. Use of multiple photonic devices in an array allows for gray scale images, which may be formed by: altering a portion of devices 402 or partially altering a portion or all of devices 402.

Array 500 is similar to array 400, except array 500 includes elongated structures 502, including electrodes 508 and 510. Optical properties of structures 502 are altered by applying a bias across the electrodes to form partially opaque or reflective structure 504 or substantially completely reflective structure 506.

Figure 6:
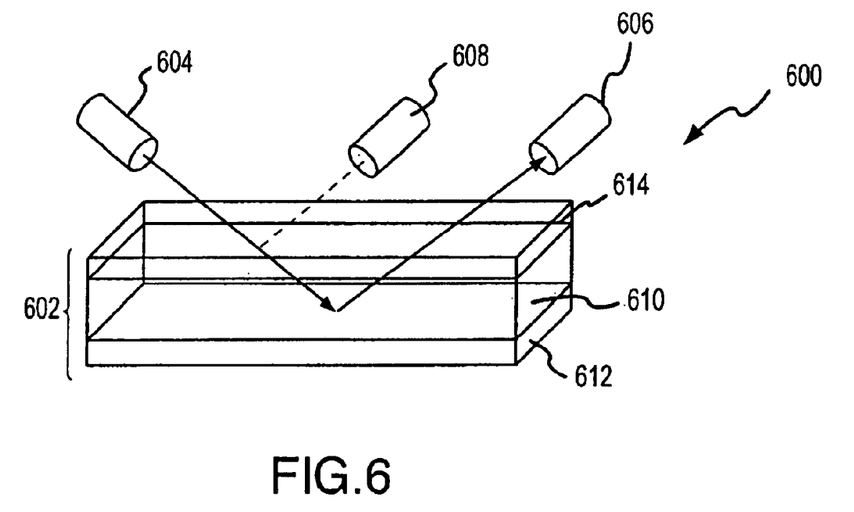
FIGS. 6 and 7 are schematic illustrations of a photonic system suitable for use as an optical switch in accordance with an embodiment of the invention.
Figure 7:
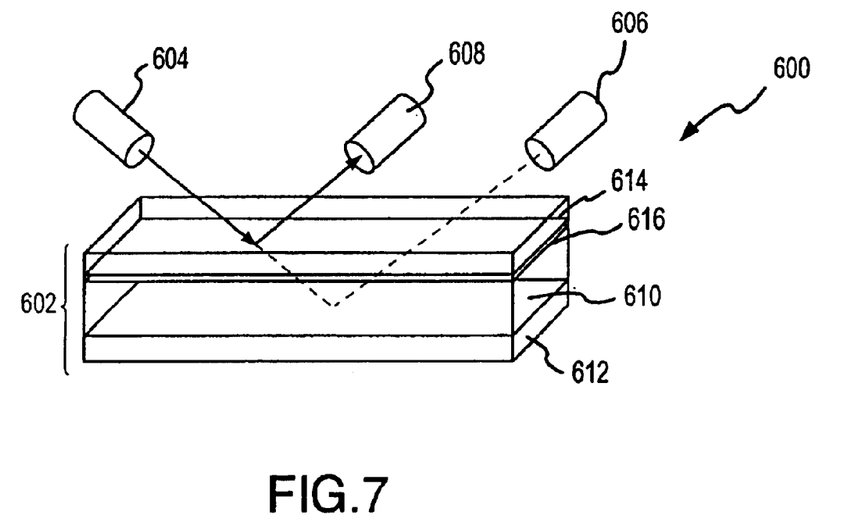

FIGS. 6–9 illustrate optoelectronic systems, suitable for optical switching applications, in accordance with various embodiments of the present invention. In particular, FIGS. 6 and 7 illustrate a system 600, including a photonic structure 602, a light emitting device 604, and light detecting device 606 and 608. Light emitting devices may include, for example, light emitting diodes or lasers such as vertical cavity surface emitting laser or edge emitting lasers, or the like; light detecting devices may include photo diode or the like.

In operation, system 600 can switch or route optical signals to devices 606 and 608 by altering the optical properties (e.g., refractive index and/or reflectivity) of a portion of structure 602 (e.g., an ion conductor region 608 of structure 602) such that the reflection angle of light emitted from device 604 changes and the light is transmitted to the desired light receiving device 606 or 608. More particularly, upon application of a bias (having energy greater than the threshold energy for oxidation) across electrodes 612 and 614, metal from one of the electrodes (e.g., electrode 612) dissolves into ion conductor 610 to alter the optical properties of region 610. For example, a region 616 of concentrated conductive material, which has a higher reflectivity than bulk conductor 610 material, forms upon application of a sufficient bias. In accordance with aspect of this embodiment of the invention, electrode 614 is formed of material such as indium tin oxide, which is substantially transparent in at least one wavelength of light transmitted between device 604 and device 606 or 608. Alternatively, the structure may include an aperture through the top electrode to allow light transmission through to conductor 610 and also allow application of a bias across the electrodes.

Figure 8:
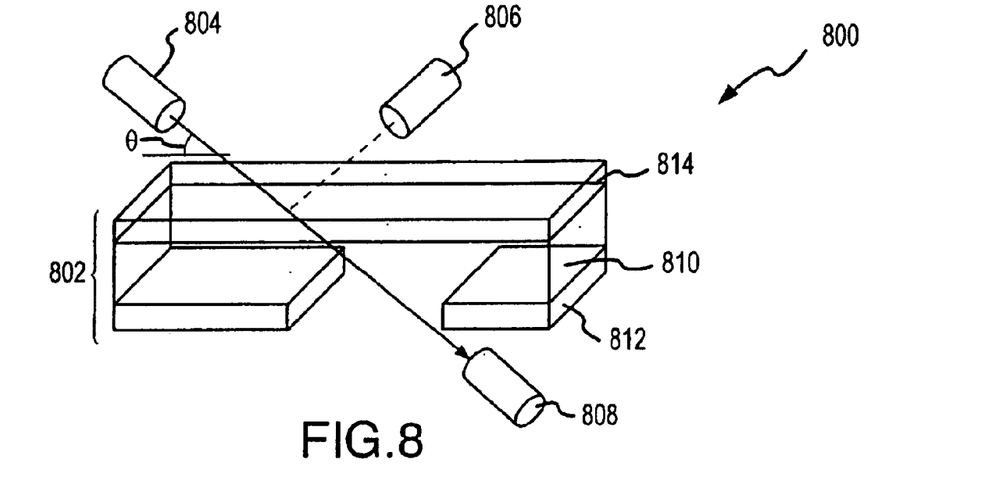
FIGS. 8 and 9 are schematic illustrations of a photonic system suitable for use as an optical switch in accordance with another embodiment of the invention.

FIGS. 8 and 9 illustrate a system 800, which includes a photonic structure 802, a light emitting device 804 and light detecting devices 806 and 808, which are formed on opposite sides of structure 802.

Structure 800 operates in a manner similar to structure 600, namely, that upon application of a sufficient bias across electrodes 812 and 814, an optical property of bulk ion conductor material 810 is altered, by forming a region 816, to select one of output devices 806 and 808.

Figure 10:
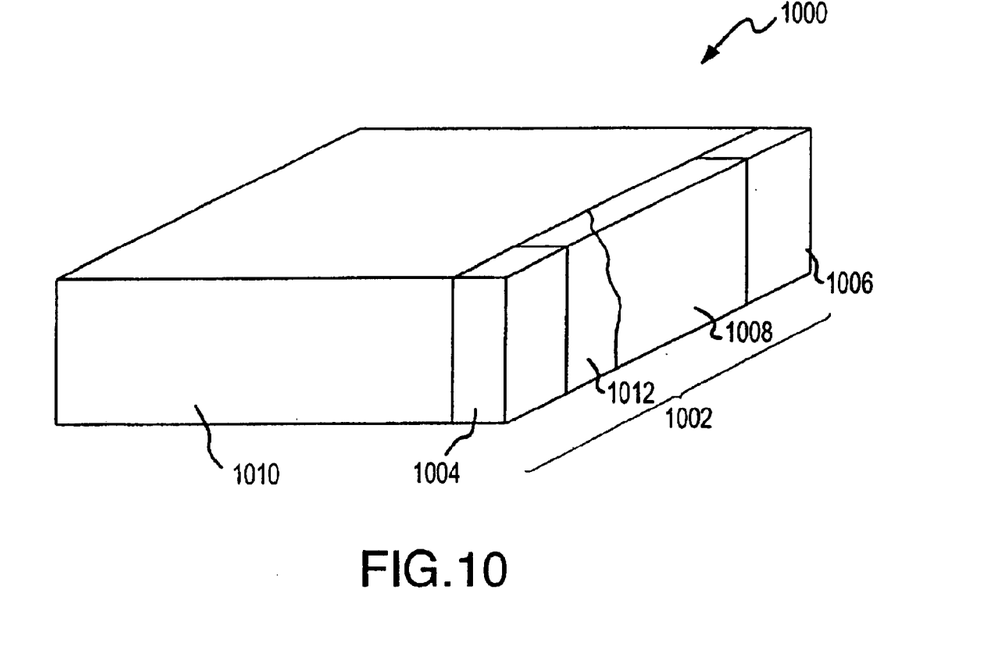
FIGS. 10 and 11 are schematic illustration of photonic systems, including a waveguide, in accordance with further embodiments of the invention.
Figure 11:
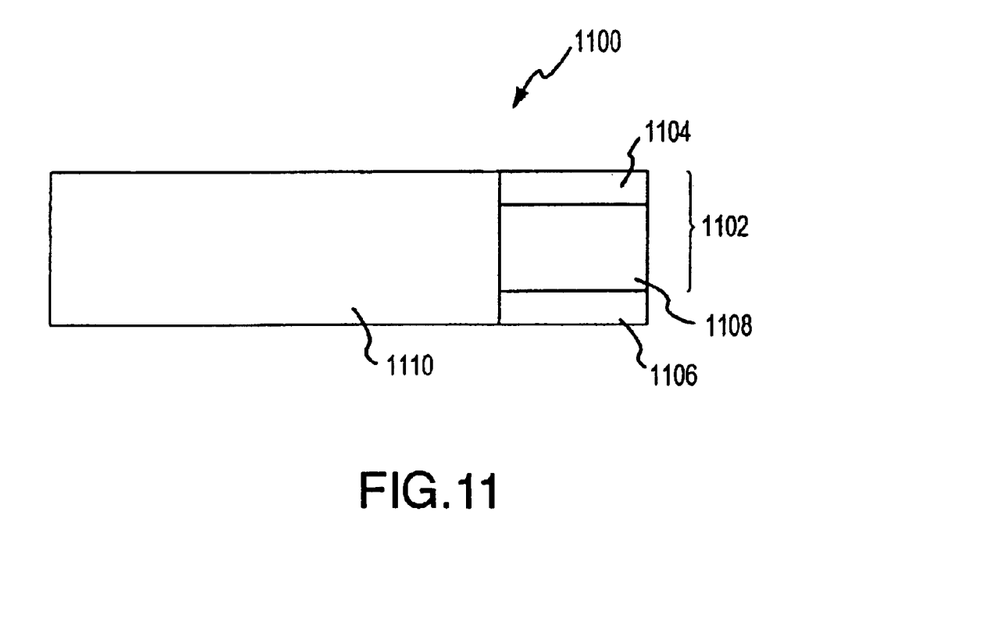

FIGS. 10 and 11 illustrate additional systems 1000 and 1100 in accordance with the present invention. Systems 1000 and 1100 are similar to systems 600 and 800, except one or more of the optoelectronic devices of system 600 and 800 are replaced by a waveguide. Although not illustrated in the drawing figures, additional systems of the present invention include both a waveguide and one or more optoelectronic devices.

System 1000 includes a photonic structure 1002, including electrodes 1004 and 1006 and an ion conductor 1008, and waveguide 1010. Electrodes 1004 and 1006 and ion conductor material 1008 maybe selected from any of the material described above in connection with structure 100. In addition, system 1000 may include various buffer and/or barrier layers as described above. Waveguide 1010 maybe formed of any suitable waveguide material (e.g., silicon oxide) and may include suitable cladding layers (not illustrated).

In operation, light is transmitted to or from waveguide 1010, and may be deflected to an optoelectronic device of another waveguide by altering the optical properties by growing a region 1012, having a higher concentration of conductive material compared to bulk conductor material 1008.

Structure 1100, illustrated in FIG. 11, includes a photonic structure 1102, having electrodes 1106 and 1108 and ion conductor material 1108. Structure 1102 may be formed of any of the material described above in connection with structure 1000, and structure 1100 operates in a manner similar to structure 1000.

Although the present invention is set forth herein in the context of the appended drawing figures, it should be appreciated that the invention is not limited to the specific form shown. For example, although the photonic structures of the present invention are described in connection with passive devices and optical switches, the application is so limited. Various other modifications, variations, and enhancements in the design and arrangement of the method and apparatus set forth herein, may be made without departing from the spirit and scope of the present invention as set forth in the appended claims.

I claim:

1. A photonic device comprising:
    an ion conductor formed of a solid solution containing a first conductive substance;
    a first electrode comprising a second conductive substance, wherein said first and said second conductive substances comprised the same material; and
    a second electrode.

2. The photonic device of claim 1, wherein said ion conductor is formed of a solid solution of a chalcogenide material and a metal.

3. The photonic device of claim 2, wherein said metal is selected from the group consisting of silver, copper, and zinc.

4. The photonic device of claim 1, further comprising a barrier material between said ion conductor and at least one of said first and said second electrodes.

5. The photonic device of claim 4, wherein said barrier layer comprises a conductive material.

6. The photonic device 4, wherein said barrier layer comprises an insulating material.

7. The photonic device of claim 4, wherein said barrier layer comprises a material selected from the group consisting of $Ag_xO$, $Ag_xS$, $Ag_xSe$, $Ag_xTe$, where x 2, $Ag_yI$, where y 1, $CuI_2$, CuO, CuS, CuSe, CuTe, $GeO_2$, $SiO_2$, $Ge_zS_{1-z}$, $Ge_zSe_{1-z}$, $Ge_zTe_{1-z}$, where z is greater than or equal to about 0.33, and combinations thereof.

8. The photonic device of claim 1, wherein said first electrode comprises excess silver.

9. The photonic device of claim 1, wherein said ion conductor comprises a solid solution selected from the group consisting of $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, $Ge_xTe_{1-x}$—Ag and combinations thereof, where x ranges from about 0.1 to about 0.5.

10. The photonic device of claim 1, wherein said ion conductor comprises a glass having a composition of $Ge_{0.17}Se_{0.83}$ to $Ge_{0.25}Se_{0.75}$.

11. The photonic device of claim 1, wherein said ion conductor comprises up to about 67 atomic percent silver.

12. The photonic device of claim 1, wherein said ion conductor includes a network modifier.

13. The photonic device of claim 1, further comprising an insulating layer formed underlying one of said first and said second electrodes.

14. The photonic device of claim 1, wherein said photonic device is formed overlying a substrate.

15. The photonic device of claim 14, wherein said substrate comprises a microelectronic device.

16. The photonic device of claim 15, wherein said photonic device is electrically coupled to said microelectronic device.

17. A passive display formed using the photonic device of claim 1.

18. An optical switch formed using the photonic device of claim 1.

19. An optical router formed using the photonic device of claim 1.

20. A photonic system comprising:
   a waveguide formed on a substrate; and
   a photonic device including an ion conductor and a plurality of electrodes, said photonic formed on said substrate and configured to alter an optical property upon application of an energy bias across said plurality of electrodes.

21. The photonic system of claim 20, further comprising an optoelectronic device optically coupled to said waveguide.

* * * * *